United States Patent [19]

Ohnigian et al.

[11] 4,073,012
[45] Feb. 7, 1978

[54] FAULT-TOLERANT MEMORY ORGANIZATION

[75] Inventors: Suran Ohnigian, Upper Darby, Pa.; Jerold A. Seitchik, Dallas, Tex.

[73] Assignee: Sperry Rand Corporation, New York, N.Y.

[21] Appl. No.: 699,554

[22] Filed: June 24, 1976

Related U.S. Application Data

[63] Continuation-in-part of Ser. No. 565,894, April 7, 1975, abandoned.

[51] Int. Cl.$^2$ ............................................. G11C 19/08
[52] U.S. Cl. ........................................... 365/1; 365/15
[58] Field of Search ................... 340/174 TF, 173 BB

[56] References Cited

U.S. PATENT DOCUMENTS 4,001,673  1/1977  Barrett ........................... 340/174 TF Primary Examiner—James W. Moffitt
Attorney, Agent, or Firm—Rene A. Kuypers

[57] ABSTRACT

There is disclosed herein a fault-tolerant memory organization which permits through the incorporation of redundancy the utilization of circuit chips having defective sections. The apparatus involves the use of redundant sections fabricated on the chip in conjunction with a data relocation technique. The relocation scheme utilizes a code-decode arrangement which inserts zeros into the data stream to avoid the defective sections and provides a zero delete arrangement when the previously coded information is retrieved.

5 Claims, 5 Drawing Figures

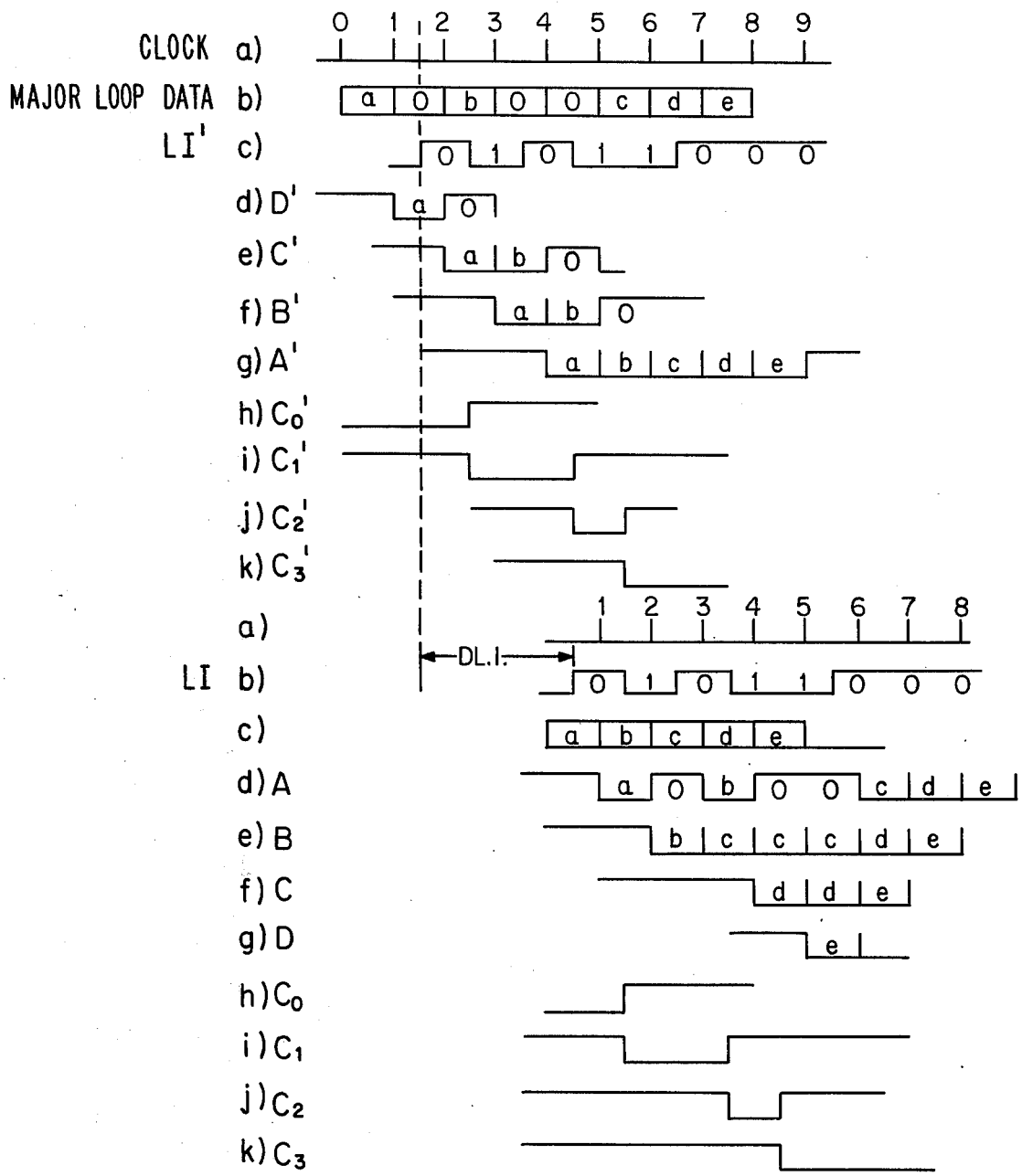

FAULT-TOLERANT MEMORY ORGANIZATION

CROSS REFERENCE TO RELATED APPLICATION

This application is a continuation-in-part of application Ser. No. 565,894, filed Apr. 7, 1975, and now abandoned.

BACKGROUND OF THE INVENTION

1. Field of the Invention

The invention relates in general to the field of micrological circuit chips and in particular to the field of bubble memories fabricated from such chips.

2. Description of the Prior Art

Known prior art references made of record in this application are U.S. Pat. No. 3,792,450 (Bogart et al.), and the 1974 Intermag Conference Papers entitled "Fault-Tolerant Memory Organization" by R. Naden and F. West, and "Field Analysis of Large Capacity Magnetic Bubble Circuits with Redundancy Design" by Bailey and Reekstin and U.S. Pat. No. 3,845,476 (Boehm).

The Bogart et al patent is considered to have shortcomings in that the patentees develop a high memory access time. This high access time results from the requirement to have timing coincidence of the information to be accessed and the bad loop information. This timing coincidence in Bogart occurs infrequently and prevents the bubble memory from becoming a viable product.

The Naden-West approach for a fault-tolerant memory organization involves the extensive sorting of chips on the basis of defects. This basically involves having a large chip inventory system which is generally unwieldy. Furthermore, this scheme is only practical for up to two defects per chip.

The Boehm approach is similar in nature to the Naden-West technique since it also involves the expensive sorting of chips. It furthermore requires that some fraction of the chips be perfect. Again, this requires a large chip inventory system.

The object of the instant invention is designed to obtain a greater yield of usable chips and at the same time to make it practical to correct for minor loop defects that occur in the field.

SUMMARY OF THE INVENTION

The present scheme involves the use of redundant minor loops in a bubble memory in conjunction with a data relocation technique. The data relocation technique provides for coding of the information to be stored in the memory by inserting zeros in the data stream so as to avoid the storage of meaningful bits into defective minor loops. As an example, if minor loops 2, 5 and 6 are defective, the input code causes zeros to be written into these loops and the information that would be written into loop 2 is written into loop 3. Similarly the information that would have been written into loops 3, 4, 5 and 6 is entered into loops 4, 7, 8 and 9. The scheme further involves a decode arrangement which eliminates the meaningless zeros that have been inserted into the data stream when the original data is to be retrieved and closes the gap created between bits. Implementation of this invention requires circuitry which both codes and decodes by respectively inserting zeros into and deleting zeros from the data stream.

It is therefore an object of this invention to provide a new method for utilizing redundancy such that the allowable number of defective loops per chip is extended beyond the limit of two. This results in a greater yield of usable chips and, at the same time, makes it practical to correct for minor loop defects that occur in the field.

BRIEF DESCRIPTION OF THE DRAWINGS

FIGS. 4 and 5 depict the timing utilized with the circuitry of FIGS. 2 and 3.

DESCRIPTION OF THE PREFERRED EMBODIMENTS

Figure 1:
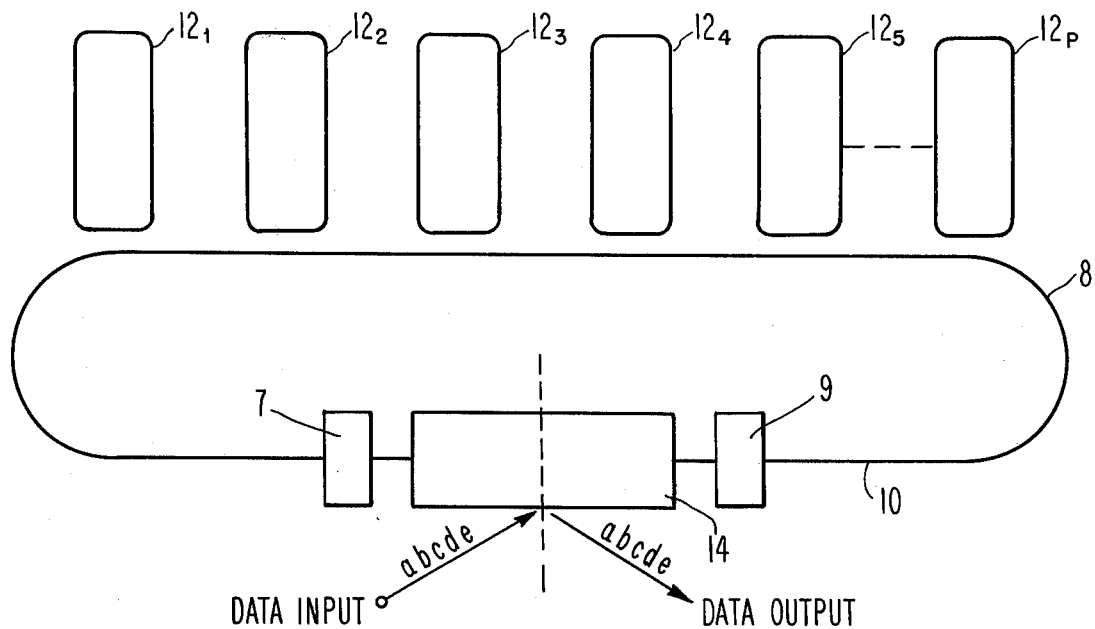
FIG. 1 is an overall arrangement of a bubble memory circuit chip.

Referring now in particular to FIG. 1, there is depicted in a general way a bubble memory circuit chip 8 comprising the major loop 10 and the contiguous minor loops $12_1$ to $12_p$. The number of minor loops are $64+n$ where $n$ is the number of allowable defective loops per chip. There is provided in the major loop 10 a loop control network (LCN) 14 for controlling the input and output data stream into the memory. In an actual bubble memory configuration, for example, there might be 72 circuit chips that are operating in parallel wherein 64 of the chips would contain data and the remaining eight chips would be used for error correction and detection. Therefore, when loading the memory, i.e., transferring a data train from the major loop 8 into the minor loops 12 each chip has an effective input data train of 64 data bits. These data bits are to be distributed among the $64+n$ minor loops such that no data is loaded into a defective minor loop. If there are no defective loops on the chip, then the 64 data bits are stored within the first 64 minor loops. It should be noted that a defective minor loop results from the fabrication process and is a result of the fact that a 100% yield of these microcircuits is not always feasible. The invention is directed to utilize these defective microcircuits such that the yield is effectively raised.

If there are no defective loops on the chip 8 the 64 data bits are stored within the first 64 minor loops $12_1$ to $12_{64}$. The data train is serially written into the major loop by means not shown but which are well known in the art. When it is determined that a certain position in the train corresponds to a defective minor loop position, the remaining input data is delayed one position for each defective loop. The delay is introduced at the corresponding defective loop position. The network which accomplishes this is shown in greater detail in FIG. 2.

Figure 2:
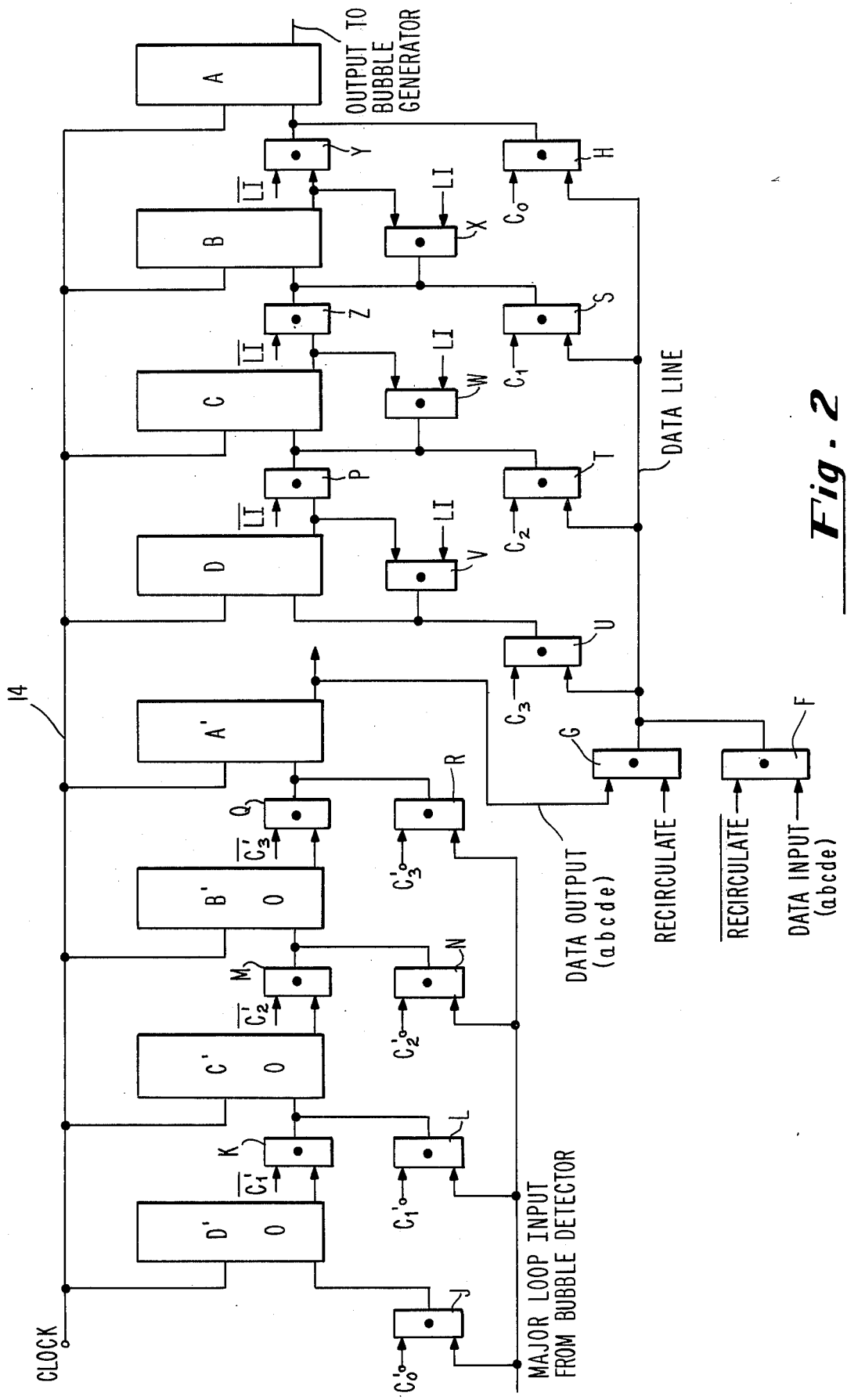
FIG. 2 is the circuitry utilized for inserting and deleting zeros into the data stream.

FIG. 2 depicts two four stage shift registers consisting of bistable flip-flop stages A'–D' and bistable flip-flop stages A–D, respectively. The state or level of the input to each stage is determined by the OR'ing of several negative AND gates that form an input network to each stage. A negative AND gate produces a low (L) output when its inputs are all L. The output state of a stage is determined by the trailing edge of a clock pulse. For example, if the OR'd input level of a stage is sampled by the clock's trailing edge and is found to be L or a $l$, its output will be L during the succeeding clock period.

In FIG. 2, the input network to stage C consists of negative AND gates P, T and W whose outputs are Or'd together. The trailing edge of the clock pulse samples the state of the OR'd point. The output of stage C will assume that of its input during the following clock period.

The shift register shown in FIG. 2 comprises the loop control network (LCN) 14 shown in FIG. 1. Attached to the LCN is a bubble generator 9 and a bubble detector 7. The bubble generator 9 and bubble detector 7 form no part of the present invention. The loop control network 14 accordingly codes the information train on the data line (FIG. 2). The coded information is used to activate the bubble generator which produces a bubble train in major loop 10 corresponding to the coded information. This bubble train is eventually stored in the minor loops $12_1$ to $12_p$. The coding of the information on the data line depends upon the minor defects that are generated in the circuit chip during the fabrication process. The read only memory (ROM) 15 is used to store the positions of the defective minor loops that are associated with each major loop. In like manner, the loop control network 14 decodes the data output of the bubble detector 7. This information represents the data bubble train on the major loop 10 as read out of minor loops $12_1$ to $12_p$. The decode-coding arrangement will be described in greater detail hereinafter.

Let us assume, for example, that the circuit chip 8 incorporates defective minor loops $12_2$, $12_4$, and $12_5$ in the minor loops configuration between $12_1$ to $12_p$. Let us further assume that the 5 bit input data stream is identified as $abcde$ which may be a combination of "1's" and "0's". The information in the data stream $abcde$ is to be stored in only the operative minor loops and the defective minor loops are to be avoided. This is accomplished in the following manner.

A clock signal (FIGS. 4a and 5a) is applied to one of the input terminals of the counter stages A–D and A'λ–D' of the shift register 14. As previously discussed the clocking signal essentially samples the input to each stage of the shift register and sets the flip-flop of the corresponding stage accordingly.

Figure 3:
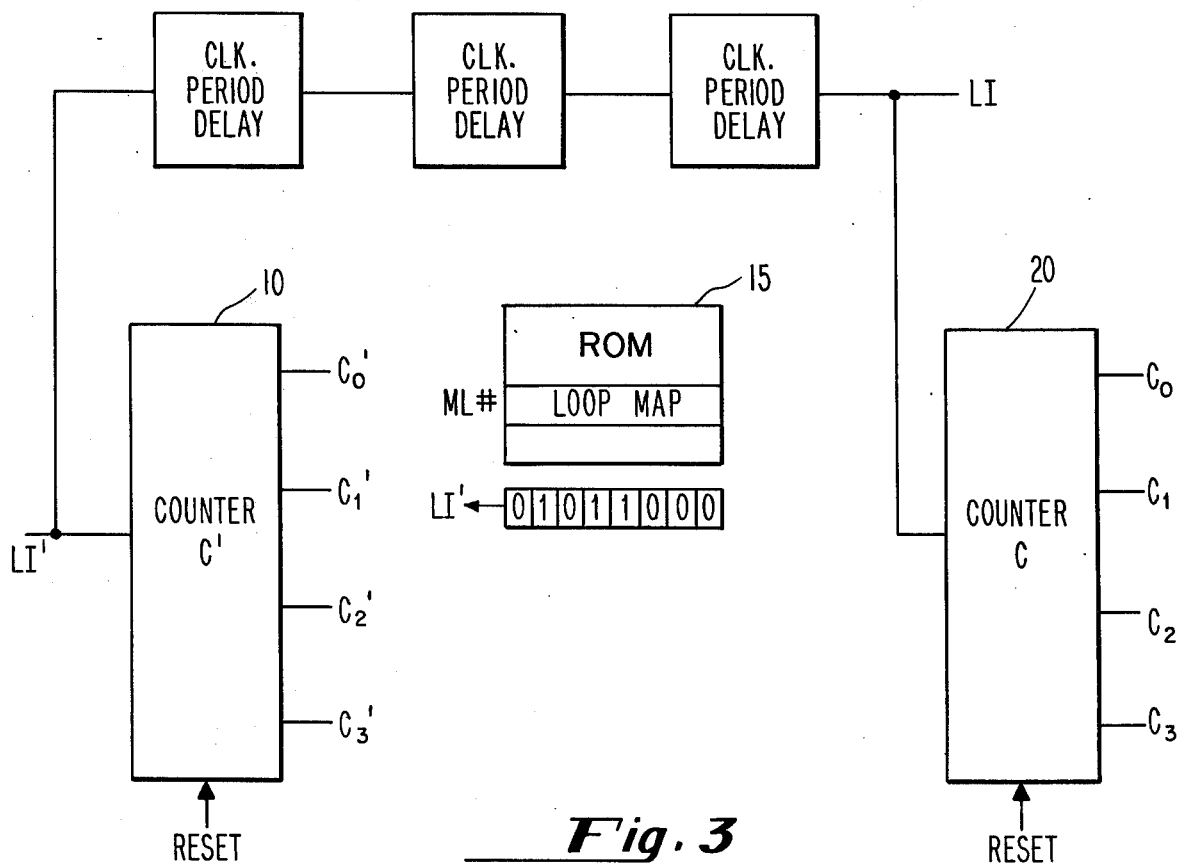
FIG. 3 is the circuitry utilized for providing the timing to direct the insert zero-delete zero operation of the code network.

Associated with the shift register 14 is a loop bit map (FIG. 3) which is utilized to store the position numbers of the defective minor loops that are common to each major loop. In other words, the loop bit map may comprise in its simplest form a ROM (read only memory) wherein the storage therein of a "1" bit would indicate the relative position of a defective minor loop, whereas the storage of a "0" bit would indicate the location of a minor loop which operated properly. Therefore, the state of the bit will indicate whether or not the corresponding minor loop is to contain data. In accordance with the original premises that the second, fourth and fifth minor loops are inoperative or defective, the loop bit map or loop train would produce the signal 01011000 . . . (see FIG. 4b and 5c) so that each bit will have a one to one correspondence with a minor loop. It should be understood by the reader that the loop bit map consists of $p$ pulses and only the pertinent portion illustrating the minor loop defects is shown. FIG. 3 shows a memory location number in the ROM wherein the loop bit map is stored. The contents of the memory location are depicted below the ROM. FIG. 5 indicates the required positioning between the major loop data input into stages A'–D' and the loop bit map LI'. FIG. 4 indicates the required positioning between the data stream on the data line (FIG. 2, 4c) and the delayed loop bit map LI (FIG. 3, 4b).

The serial data bit train of five bits $abcde$ on the data line is to be stored only in the operative minor loops. It again should be understood by the reader that these five bits are the leading bits of a data train comprising 64 bits. There is a one to one correspondence between the bit positions in the output train from stage A and the minor loops. The network A–D provides the required transformation between the two data trains by introducing a delay equal to a data bit period within the $abcde$ train for each defective minor loop such that the data bits $abcde$ are written into operative minor loops. In our example, the output data train from stage A' should be $a0b00cde$ for a loop bit map of 01011000. The 1's in the loop bit map indicate the positions of the defective minor loop.

The LI' signal is applied from the ROM output to the counters 10 and 20 (FIG. 3) after they are initially cleared. The LI' signal is used only to produce the signals $C_0'-C_3'$. The counters advance for every "1" in the loop train from the ROM 15. There is a three clock period delay between the inputs of the two counters. Therefore, after the signal LI' is delayed by a three clock period delay, the signal LI is produced. Signals $C_0-C_3$ are produced by the action of the LI signal on counter C. The counter is advanced by every "1" in the delayed loop bit map train LI. Initially, the counters 10, 20 are set so that $C_0'$ and $C_0$ (FIG. 4h and 5h) are reset or are at ground or negative potential. The data input train $abcde$ (FIG. 4c) appearing on the DATA LINE may represent new data to be entered into the major loop via gate F enabled by the $\overline{RECIRCULATE}$ signal, or the train can be the output of stage A' enabled by the RECIRCULATE signal on gate G, wherein these signals are produced by well-known control signals from the device which this system is being used with, e.g. computer, electronic device, etc. (not shown).

There is a half clock period delay between the train on the data line (FIG. 4c) and the LI train (FIG. 4b). This is to insure that the LI, $\overline{LI}$, and $C_n$ signals are at a steady state at the time when the clock pulse is effectively sampling the input state of stages A through D. These signals control the information flow through the gates.

At the generation of the first clock pulse (FIG. 4a) loop control signal $\overline{LI}$ (FIG. 4b) enable negative AND gates Y, Z and P. However, since the input signals to the gates from stages B, C and D respectively are at the O or H state these gates are not conditioned. As a result, the states of stages A, B and C are unaffected by gates Y, Z and P because their respective outputs are at a H state. Control signal $C_0$ which is L (see 4H) enables gate H and the state of stage A is determined by bit "a" of the data input train $abcde$ whose polarity is positive or negative depending upon whether it is a one or zero. For example, let us assume that a binary "1" is L and a binary "O" is H and the letter "a" is a "1". Therefore, gate H is conditioned because both inputs are L and its output is L. The OR'd input to stage A is therefore L. This L signal causes the flip-flop A to be set. Gate Y is blocked because the output of stage B is "0" or H. Gates X, W and V are all blocked because LI is H during the first clock pulse (FIG. 4b) and gates P, Z and Y are also blocked because stages, B, C, and D are all "O's" or H. In other words, all the other control signals to stages A thru D disenable the gates which they control. The notation 000a or in our binary example, 000/1 signifies that the data to the right of the slash is the effective input train to a bubble generator. The first four bits in the above notation represents information stored in stages D, C, B and A, respectively of the shift register. This notation will be used to denote the state of the coding network. The effective input train to the bubble generator 9 will be the output from stage A starting with the first clock interval.

It should be noted that the "1" in the loop train steps the counter 20 to $C_1$ from $C_0$. At the time of the second clock pulse, control signal LI (FIG. 4b) is L and enables the gates X, W and V whose inputs from stages B, C and D respectively are at the O or H state and therefore they are blocked. Control signal $C_1$ enables gate S because it is L and the state of stage B is determined by bit b on the data line. Let us assume that bit "b" is a "0" or H. Therefore gate S is not permissed. Gate X is blocked because the output of stage B is 0 or H, and gate Z is blocked in view of $\overline{LI}$ being H. The input states therefore of D thru A are 00b0 or in binary form 0000, respectively. The state of the coding network changes to 00b/0a (i.e. 000/01). In effect, a 0 bit is inserted between bits "a" and "b". This was done because the second minor loop was defective.

From here on in, the binary form will not be used for the purpose of simplicity. At the time of the third clock pulse, the control signal $\overline{LI}$ which is L (FIG. 4b) enables gates Y, Z and P whose inputs from stages B, C and D respectively are b00 so that bit b is transferred to stage A. Control signal $C_1$ which is still L enables gate S and bit C on the data line is transferred to stage B. Gates U and T are not enabled because $C_2$ and $C_3$ are H during the third clock pulse. Therefore, the input states of D thru A are 00cb respectively. The state of the coding network changes to 00c/b0a.

The fourth minor loop is defective. At the time of the fourth clock pulse, control signal LI which is L enables gates X, W and V whose inputs from stages B, C and D respectively are c00. Control signal $C_2$, which was stepped by the LI being a "1" enables gate T and the state of stage C is determined by bit d on the date line. The input states of D thru A are 0dc0, respectively. The state of the coding network changes to 0dc/0b0a.

In our example, the fifth minor loop is defective. At the time of the fifth clock pulse, control signal LI which is L enables gates X, W and V whose inputs from stages B, C and D respectively are cd0. Control signal $C_3$ which is stepped by another "1" in FIG. 4b reverts to a L state and enables gate U and the state of stage D is determined by bit e on the data line. The input states D thru A are edc0. The state of the coding network changes to edc0/0b0a.

The remaining minor loops are good. From this point on the rest of the data on the data lines enters via gate U and the data is shifted serially thru stages D, C, B, A and then onto the major loop, i.e., fedc/00b0 a.

In essence, a "1" in the loop bit map denotes a defective minor loop position. Its presence will inhibit the serial shift gates Y, Z and P since $\overline{LI}$ is H and enable the recirculation gates X, W and V since LI is L. The counter 20, which provides the enabling signals to gates H, S, T and U, is advanced. This causes the data on the data line to enter the coding network one stage later. In other words, prior to the first "1" in the LI train, the data on the data line enters stage A via gate H, which is enabled by signal $C_0$. When the first defective loop is encountered as indicated by "1" in the loop train LI, the counter 20 is advanced to $C_1$. The data on the data line will now enter stage B via gate S, which is enabled by signal $C_1$. The recirculated information in stages C and D maintains these stages in their initial "0" state by the recirculation gates W and V, respectively. As a result of the "0" being recirculated via gate X, the input state of stage B is controlled by gate S.

In summary, it can be seen that the loop control mechanism shown in a portion of FIG. 2 codes the data input bits a, b, c, d, and e in such a manner that the bubble train produced by the bubble generator 9 will not store these bits in minor loops which have defective storage capability. It will be recalled the minor loops $12_2$, $12_4$, and $12_5$ were deemed to be defective so that the data a, b, c, d, and e was to be coded to enable the bubbles to avoid these defective loops. This was accomplished by shifting into the bubble generator the respective data train a0b00cde such that a bubble corresponding to bit a is stored in the minor loop $12_1$, a bubble corresponding to the bit b is stored in loop $12_3$, the bubble corresponding to bit c is stored in the loop $12_6$, a bubble corresponding to the bit d is stored in the minor loop $12_7$ and finally the bubble corresponding to the bit e in the loop $12_8$ and so on. Since in our example, there are no more defects, the remainder of the bubbles corresponding to the information on the data line is stored in consecutive minor loops. The transfer of the respective data bits from the major loop to the minor loop forms no part of this invention and one such arrangement for accomplishing this transfer is described in patent specification Ser. No. 407,675 now U.S. Pat. No. 3,896,421.

The following describes how the coded information a0b00cde, which circulated in the major loop 8 and was stored in the minor loops $12_1$–$12_p$ is decoded by the loop control network 14 after being sensed by the bubble detector 7 before it enters the data output terminal shown in FIG. 1. This is accomplished in the following manner.

After the bubbles are detected by the bubble detector 7, the data train a0b00cde is produced (FIG. 5b) and is applied to the major loop input terminal of the shift register 14 (FIG. 2). The counter 10 is first reset by well known means so that the terminal $C_0'$ (FIG. 5h) is negative whereas all remaining outputs $C_1'$–$C_3'$ are H as can be readily seen. Therefore, at the trailing edge of the first clock signal (FIG. 5a) the negative $C_0'$ signal (FIG. 5h) enables gate J. The state of stage D' is determined by the data bit "a". The data bit "a" is shown stored in stage D' (FIG. 5d). Stages A', B', and C' of the shift register remain in the reset stage at this time because $C_1'$, $C_2'$ and $C_3'$ block negative AND gates L, N and R, and the "0" or H output of stages D', C' and B' block gates K, M and Q. Upon the generation of the second clock pulse $\overline{C_1'}$ is negative since $C_1'$ (FIG. 5i) is positive so that the gate K is enabled and the bit "a" is transferred from stage D' to stage C' (FIG. 5e). Also since $C_0'$ (FIG. 5H) is negative at this time the gate J is enabled and the "0" bit on the major loop input line is stored in stage D' (FIG. 5d). Therefore, at this point in time the "a" bit is stored in stage C' and the "0" is stored in stage D".

The counter 20 is stepped by the "1" in the LI' train between the second and third clock pulses (FIG. 5c). The negative $C_1'$ signal enables gate L.

The trailing edge of the third clock pulse causes the data bit "a" to be shifted to stage B' (FIG. 5f) and bit "b" to be stored in stage C' (FIG. 5e) in the following manner. It is noted that $C_2'$ (FIG. 5j) is positive at this time so that its negation $\overline{C_2'}$ is negative. This causes gate M to be enabled and the state of stage B' is determined by data bit "a" since gate N is blocked by $C_2'$ which is positive. $C_1'$ (FIG. 5i) is negative at the third clock time and accordingly gate L is enabled. Therefore, the state of stage C' is determined data bit "b" on the major loop input line. Gate K is not enabled because $\overline{C_1}$ is positive.

The fourth clock pulse causes the "a" bit to be shifted to stage A', the "b" bit to be shifted to stage B' and the 0 bit to be stored in stage C'. The output of stage A' is the data output (FIG. 1). These transfers are obtained in the following manner. The signal $C_3'$ (FIG. 5k) is H at this time and its negation, $\overline{C_3'}$, causes the enabling of the gate Q so that upon the generation of the clock pulse the "a" bit is transferred from stage B' to stage A'. Gate R is not enabled because $C_3'$ is positive. In like manner $C_2'$ (FIG. 5j) is positive during this time period so that its negation $\overline{C_2'}$ enables gate M and a transfer of the bit "b" occurs from stage C' to B'. $C_2'$ being positive causes gate N to not be enabled. However, during the fourth clock period the signal $C_1'$ (FIG. 5i) is negative so that gate L is enabled and the state of stage C' is determined by the "0" bit, which is the next bit emanating from the major loop input (FIG. 5b). Gate K is blocked during this time by the positive $\overline{C_1'}$ signal and there is no transfer from stage D' to C'.

The counter 10 is advanced to $C_2'$ between the fourth and fifth clock pulses by the detection of a "1" in the LI' train (FIG. 5c). At the fifth clock pulse, the signal $C_3'$ (FIG. 5k) is positive and therefore $\overline{C_3'}$ will be negative so that gate Q is enabled. The state of state A' is therefor determined by the "b" bit from stage B' (see 5g) and therefore bit "b" appears on the data output line. Also, gate N is enabled by $C_2'$ (FIG. 5j) and gate M is not enabled by $\overline{C_2'}$ because it is positive. The state of stage B' is determined by the "0" on the major loop input line. Signal $\overline{C_1'}$ is negative because $C_1'$ is positive (FIG. 5i) so that gate K is enabled. The state of stage C' is determined by the "0" bit from stage D'. $C_0'$ is positive (FIG. 5h) so that gate J is not enabled, which causes a "0" bit to be continually written into stage D' at clock time.

The counter 10 is advanced to $C_3'$ between the fifth and sixth clock pulses by the detection of a "1" in the LI' train. $\overline{C_3'}$ is positive and gate Q is not enabled.

At the sixth clock pulse, signal $C_3'$ is negative (FIG. 5k) so that gate R is enabled and the "c" bit determines the state of stage A' and therefore bit "c" appears on the data output line. The input of stage A is controlled by gates R and Q and from this time on, gate R is enabled by $C_3'$ and gate Q is disabled by $\overline{C_3'}$. The rest of the network consisting of stages B', C', D' and gates M, K, N, L, J will have no effect on the data output of stage A.

At subsequent clock pulse times, the data output of stage A' is determined by the information on the major input line from the bubble detector 7. The data bits "d" and "e" are transferred to the data output line (stage A') on the trailing edge of the seventh and eighth clock pulses, respectively.

From the above it can be readily seen that the coded data stream a0b00cde has been converted to its original form abcde. Furthermore, it can be readily seen that through the incorporation of redundancy bubble memory chips which have defective minor loops may be avoided thereby permitting to the greater utilization and the greater yield in this type of device.

In summary, the operation of register A', B', C', D' is as indicated below.

The registers and the C' counter are initially cleared. The data enters via gate J because of the enabling control signal $C_0'$. The data continues shifting from D' to C' to B' to A'. The 0 from the defective loop enters in the normal method. However, at the next clock pulse time, the data input is shifted up one stage and the 0 from the defective loop is inhibited from shifting. This, in essence, eliminates the 0 due to the defective loop from the train shifting thru the registers. The stages which are bypassed begin filling up with 0's.

What is claimed is:

1. The method of storing information in a memory device having at least one defective storage area comprising the steps of,
   a. providing a serial input data bit stream for storing information in said memory device;
   b. adding bits to said data stream to modify said stream in accordance with predetermined information which indicates the location of said defective storage areas;
   c. storing said modified data stream in said memory device such that the input data bits are not stored in said defective areas;
   d. recovering said input serial data bit stream from said memory device by removing the added bits from the modified bit stream as read out from the memory device.

2. The method in accordance with claim 1 wherein said step of modifying said data stream comprises,
   a. inserting zero bits in said input data stream in accordance with said predetermined knowledge of where said defective storage areas are located, said zero bits modifying said data bit stream so that the input data bits are not stored in defective cells.

3. The method in accordance with claim 2 wherein said step of removing said additional data bit comprises,
   a. removing said zero bits from said modified data stream as read out from memory in order to restore the original serial input stream.

4. The method of modifying an input serial data bit stream by shifting data bits in a shift register comprising the steps of:
   a. initializing the shift register wherein all the stages are reset to the same binary value;
   b. providing a plurality of input gates to each respective stage of the register; one of said gates at each stage proving an entry point for the input stream; initially said input stream entering said shift register via the entry point of the output stage;
   c. introducing a delay into the bit stream in predetermined locations by recirculating the existing data bits present in said respective stages and
   d. shifting the entry point for the input stream one stage removed from the output stage for each unit delay, said input data stream thereby being modified by introducing delays in predetermined locations such that said modification increasing the length of the input bit stream.

5. The method of recovering an original input bit stream which has been modified by introducing delays at predetermined locations therein comprising the steps of:
   a. initializing the shift register wherein all the stages are reset to the same binary value,
   b. providing two input gates for each stage and providing complementary control signals for the respective gates of each stage, c. providing an entry point for the modified input stream through one of said gates at each stage, and providing a transfer path from a preceding stage through the second gate, d. initially said modified input stream entering said shift register via the entry point of a first stage of the register, e. shifting the entry point for the bit following each delay in the modified train one stage from the input stage and toward the output stage, f. the information being shifted from the entry point through the following stages of the shift register via the second gates of the succeeding stages, g. inhibiting the second gate of the entry stage by means of the complementary signal which blocks the transfer of information from the preceding stage, thereby the delays within the modified data stream are eliminated and the bit stream from the output stage is in its original form.

* * * * *